United States Patent
Tada

(10) Patent No.: US 8,630,405 B2
(45) Date of Patent: Jan. 14, 2014

(54) ECHO REMOVING APPARATUS

(75) Inventor: Yukio Tada, Iwata (JP)

(73) Assignee: Yamaha Corporation (JP)

( * ) Notice: Subject to any disclaimer, the term of this patent is extended or adjusted under 35 U.S.C. 154(b) by 980 days.

(21) Appl. No.: 12/677,200

(22) PCT Filed: Sep. 24, 2008

(86) PCT No.: PCT/JP2008/067207
§ 371 (c)(1),
(2), (4) Date: Mar. 9, 2010

(87) PCT Pub. No.: WO2009/041446
PCT Pub. Date: Apr. 2, 2009

(65) Prior Publication Data
US 2010/0195815 A1    Aug. 5, 2010

(30) Foreign Application Priority Data
Sep. 28, 2007 (JP) .................. 2007-253906

(51) Int. Cl.
*H04M 1/00* (2006.01)
*H04M 9/00* (2006.01)
*H04M 9/08* (2006.01)

(52) U.S. Cl.
USPC ............. 379/406.01; 379/406.06; 379/406.08

(58) Field of Classification Search
USPC ............................ 379/406.01, 406.06, 406.08
See application file for complete search history.

(56) References Cited

U.S. PATENT DOCUMENTS

2002/0181698 A1   12/2002   Takahashi et al.
2007/0036343 A1    2/2007   Sudo et al.

FOREIGN PATENT DOCUMENTS

| JP | 10-163931 A | 6/1998 |
| JP | 10-229354 A | 8/1998 |
| JP | 2000-101485 A | 4/2000 |
| JP | 2001-268213 A | 9/2001 |
| JP | 2006-333215 A | 12/2006 |
| JP | 2007-097050 A | 4/2007 |
| WO | 01/54296 A1 | 7/2001 |

OTHER PUBLICATIONS

Office Action Issued in Corresponding Japanese Patent Application 2007-253906 issued May 8, 2012.
International Search Report issued in corresponding PCT/JP2008/067207 mailed Dec. 22, 2008.
Extended search report issued in corresponding European application No. 08832817.4-1246 dated Oct. 7, 2010.

*Primary Examiner* — Quynh Nguyen
(74) *Attorney, Agent, or Firm* — Rossi, Kimms & McDowell LLP

(57) ABSTRACT

An echo removing apparatus that can remove an echo appropriately if the produced sound volume becomes large although the configuration is simple is provided. A control section 17 switches the operations of an echo suppressor 14 and an echo canceller 15 in response to the volume value input from a volume operation section 18. If the volume value is large, the echo suppressor 14 is operated and an echo is suppressed reliably. If the volume value is small, the echo canceller 15 is operated and double talk is enabled.

6 Claims, 4 Drawing Sheets

| VOLUME VALUE | GAIN OF ATTENUATION SECTION 32 | PARAMETER OF ADAPTIVE FILTER 51 |
|---|---|---|
| 0 | 100% | PARAMETER 01 |
| 1 | 90% | PARAMETER 02 |
| ⋮ | ⋮ | ⋮ |
| 10 | 0% | PARAMETER 10 |

ECHO REMOVING APPARATUS

This application is a U.S. National Phase Application of PCT International Application PCT/JP2008/067207 filed on Sep. 24, 2008 which is based on and claims priority from JP 2007-253906 filed on Sep. 28, 2007 the contents of which is incorporated herein in its entirety by reference.

TECHNICAL FIELD

This invention relates to an echo removing apparatus including an echo canceller and an echo suppressor.

BACKGROUND ART

As a technique of removing an echo, an echo suppressor for making a comparison between the level of a signal of a produced sound and the level of a signal of a collected sound and reducing the gain of the collected sound side when the level of the signal of the collected sound is low is known. An echo canceller for estimating a transfer function of an acoustic transmission space and removing a pseudo echo component from a signal of a collected sound is also known.

Since the echo suppressor lowers the gain of the collected sound side, an echo is not transmitted to the associated party, but double talk (a state in which both talking parties talk at the same time) cannot be performed. The echo canceller enables the double talk, but cannot completely remove the echo if the produced sound volume is too large.

Then, a technique of detecting whether or not the state is a double talk state in real time and using an echo canceller if the state is the double talk state and using the echo suppressor if the state is not the double talk state (For example, refer to Patent Documents 1 and 2).
Patent Document 1: JP-A-10-163931
Patent Document 2: JP-A-10-229354

DISCLOSURE OF THE INVENTION

Problems to be Solved by the Invention

However, in the apparatuses in Patent Documents 1 and 2, the echo canceller is always used at the double talk time and thus if the produced sound volume is too large, an echo cannot completely be removed as described above.

It is therefore an object of the invention to provide an echo removing apparatus that can remove an echo appropriately if the produced sound volume becomes large although the configuration is simple.

Means for Solving the Problems

An echo removing apparatus of the invention includes a sound operation section that accepts a volume operation of a produced sound; an echo canceller that generates a pseudo echo signal based on a produced sound signal and removes the pseudo echo signal from a collected sound signal to suppress an echo component; an echo suppressor that suppresses a gain of the collected sound signal based on a comparison result between the produced sound signal and the collected sound signal; and a control section that performs switching between an operation of the echo canceller and an operation of the echo suppressor based on the volume operation of the sound operation section.

In this configuration, the operations of the echo canceller and the echo suppressor are switched in response to the volume operation (volume setup value). If the volume value is large, the echo suppressor is operated. If the volume value is small, the echo canceller is operated. If the volume value is large, it can be determined that the user listens to the sound of the associated party, and the double talk is not required. Therefore, the echo suppressor is operated, and an echo is suppressed reliably. On the other hand, if the volume value is small, it can be determined that the user talks. Therefore, the echo canceller is operated, whereby double talk or single talk on the near-end side is handled.

The echo removing apparatus of the invention further includes a storage section that stores a parameter of the echo canceller and a gain of the echo suppressor which correspond to a volume setup value of the sound operation section. The control section reads the parameter of the echo canceller and the gain of the echo suppressor from the storage section based on the volume operation of the sound operation section and sets the parameter and the gain in the echo canceller and the echo suppressor.

In this configuration, the parameters of the echo canceller and the gains of the echo suppressor corresponding to the volume setup values are previously stored in memory. If the volume setup value is changed, the effectiveness state of the echo canceller and the echo suppressor is switched smoothly.

Further, the echo suppressor suppresses the gain when a level ratio between the produced sound signal and the collected sound signal exceeds a threshold value. The control section changes the threshold value based on the volume operation of the sound operation section.

In this configuration, if the volume setup value is changed, the threshold value of the echo suppressor is changed. Generally, if the level of the produced sound signal is larger than the level of the collected sound signal, the echo suppressor lowers the gain and does not output the collected sound signal; for example, if the volume value is large, setting is made so as to lower the gain only if the collected sound signal is considerably larger than the produced sound signal. If the volume setup value is large, it can be determined that the user listens to the sound of the associated party; when a sound higher than the level of the produced sound signal is collected, it can be determined that the user talks with the volume setup value intact and thus double talk is enabled.

Further, the echo suppressor changes the gain based on the volume operation of the sound operation section.

In this configuration, the gain of the echo suppressor is changed in response to the volume setup value. For example, the gain is increased gradually as the level of the produced sound signal becomes smaller. Accordingly, the operations of the echo suppressor and the echo canceller are switched more naturally.

Advantages of the Invention

According to the invention, an echo can be removed appropriately if the produced sound volume becomes large although the configuration is simple.

DESCRIPTION OF REFERENCE NUMERALS

Figure 1:
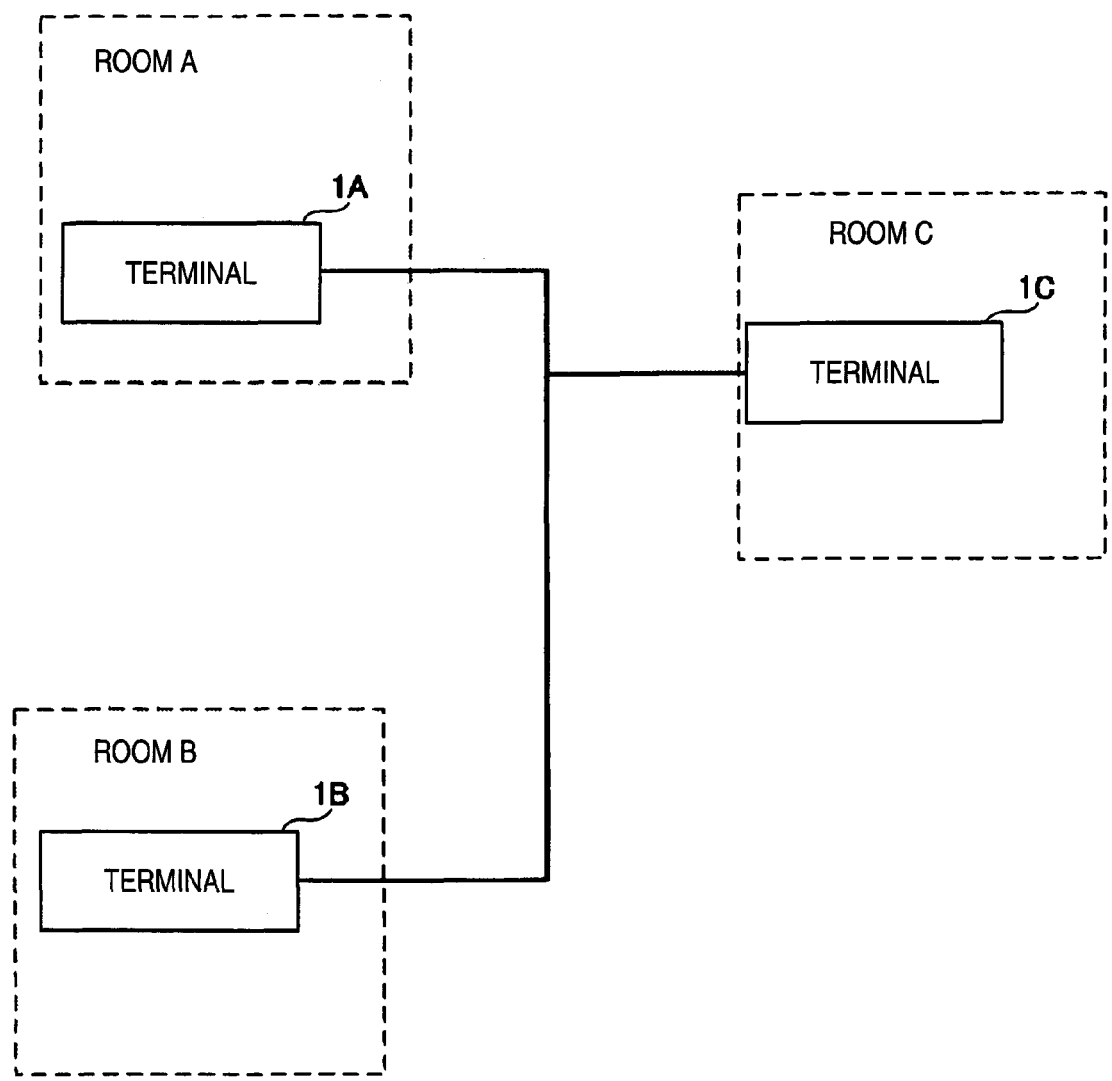
FIG. 1 is a block diagram to show the configuration of a sound producing and collecting system.
Figure 2:
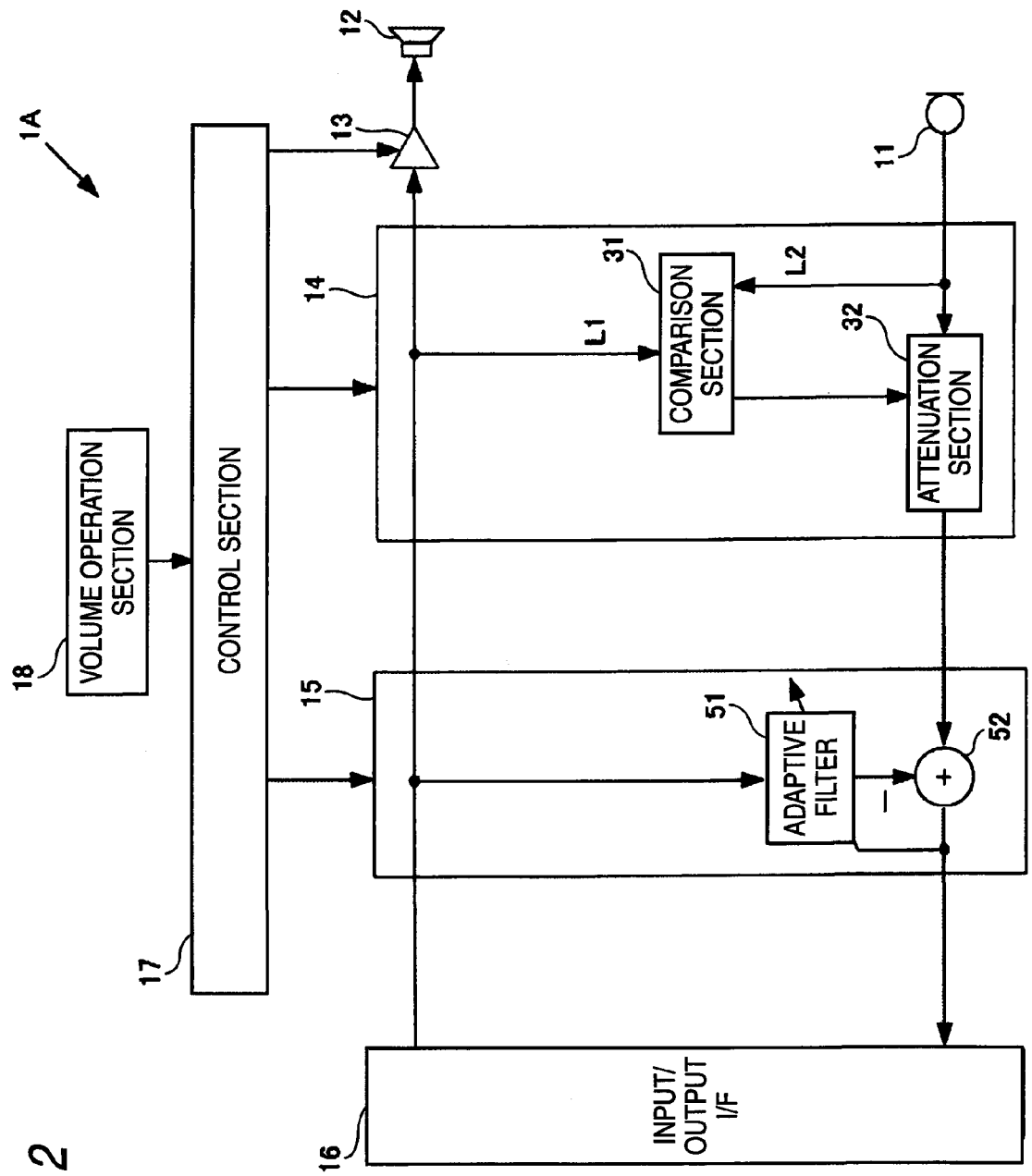
FIG. 2 is a block diagram to show the configuration of a terminal.

1—Terminal
11—Microphone
12—Loudspeaker
13—Amplifier
14—Echo suppressor
15—Echo canceller
16—Input/output I/F
17—Control section
18—Volume operation section Best Mode For Carrying Out The Invention A sound producing and collecting system will be discussed as an embodiment according to the invention. FIG. 1 is a block diagram to show the configuration of the sound producing and collecting system apparatus. FIG. 2 is a block diagram to show the configuration of each terminal.

The sound producing and collecting system is made up of a plurality of terminals connected through a PLC (Power Line Communications) network. The network mode in the invention is not limited to the PLC. In the embodiment, an A/D converter, a D/A converter, and the like are omitted and unless otherwise specified, sound signals transmitted in the apparatus are all digital sound signals.

In FIG. 1, the sound producing and collecting system includes a plurality of (in the figure, three) terminals 1A to 1C. The terminals 1A to 1C are installed in rooms A to C respectively. The terminals 1A to 1C have the same configuration and the same function; FIG. 2 shows the configuration of the terminal 1A as a representative. The number of terminals is not limited to the example.

The terminal 1 includes a microphone 11, a loudspeaker 12, an amplifier 13, an echo suppressor 14, an echo canceller 15, an input/output I/F 16, a control section 17, and a volume operation section 18. The echo suppressor 14 includes a comparison section 31 and an attenuation section 32. The echo canceller 15 includes an adaptive filter 51 and a post processor 52.

The input/output I/F 16 has a sound input terminal and a network terminal, etc. Since the terminal is a terminal for performing network communications according to PLC, a power cable connected to a receptacle in a home becomes a network terminal. The terminal 1A inputs and outputs a sound signal through the input/output I/F 16. For example, in FIG. 1, the terminal 1A transmits and receives a sound signal as sound information conforming to a predetermined protocol to and from a different terminal in the network (terminal 1B, terminal 1C). The input/output I/F 16 inputs a sound signal received from a different apparatus to the adaptive filter 51 of the echo canceller 15, the comparison section 31 of the echo suppressor 14, and the amplifier 13. The amplifier 13 amplifies the input sound signal and outputs the amplified sound signal to the loudspeaker 12. The amplification amount is set by the control section 17. The loudspeaker 12 accepts the amplified sound signal and produces a sound.

Figure 3:
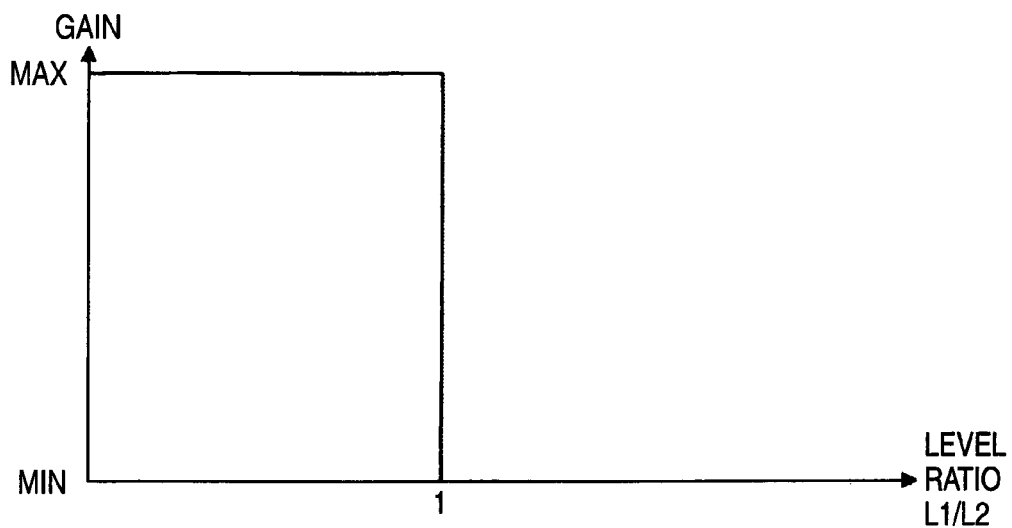
FIGS. 3(A), 3(B), and 3(C) are drawings to show gains of an attenuation section 32 relative to the ratio between a produced sound signal L1 and a collected sound signal L2.
Figure 3:
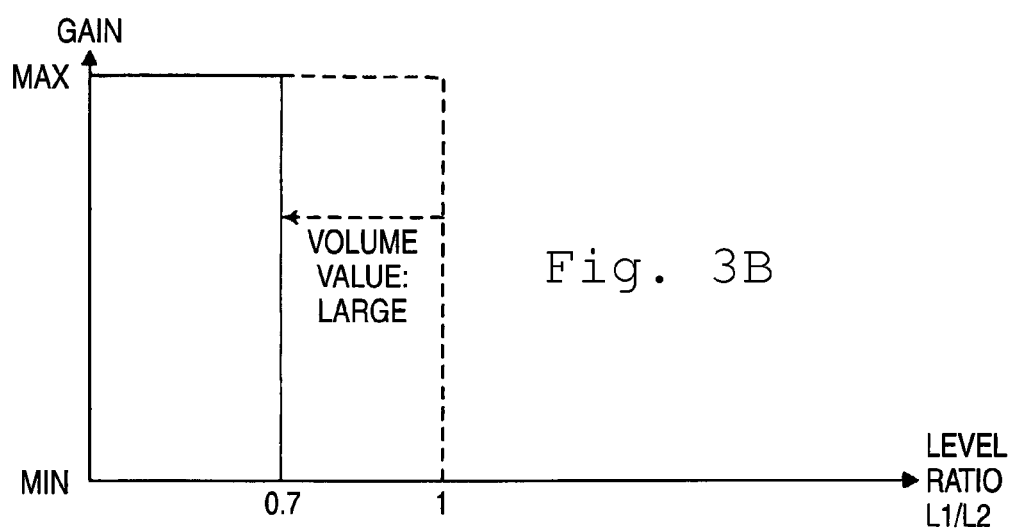
Figure 3:
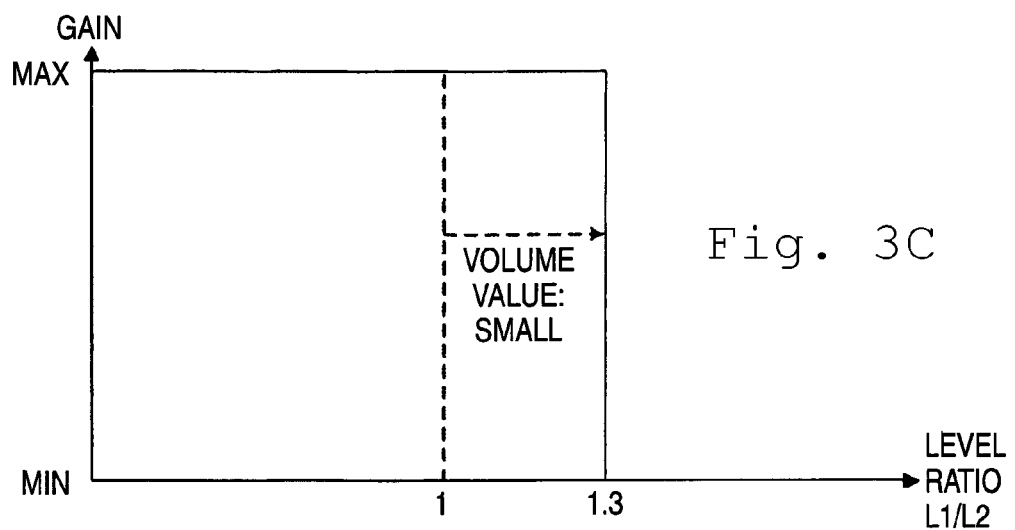

A sound collected by the microphone 11 (collected sound signal L2) is input to the comparison section 31 and the attenuation section 32 of the echo suppressor 14. The comparison section 31 makes a comparison between the level of a sound signal from a different apparatus input from the input/output I/F 16 (produced sound signal L1) and the level of the collected sound signal L2. The comparison section 31 sets the attenuation section 32 so as to output the collected sound signal L2 if the level of the collected sound signal L2 is higher than the level of the produced sound signal L1; sets the attenuation section 32 so as not to output the collected sound signal L2 if the level of the produced sound signal L1 is higher than the level of the collected sound signal L2. FIGS. 3(A), 3(B), and 3(C) are drawings to show gains of the attenuation section 32 relative to the ratio between the produced sound signal L1 and the collected sound signal L2. As shown in FIG. 3(A), if (produced sound signal L1)/(collected sound signal L2) is less than 1, namely, the level of the produced sound signal L1 is less than the level of the collected sound signal L2, the gain of the attenuation section 32 is set to MAX (for example, 100%). On the other hand, if (produced sound signal L1)/(collected sound signal L2) is equal to or greater than 1, namely, the level of the produced sound signal L1 is equal to or greater than the level of the collected sound signal L2, the gain of the attenuation section 32 is set to MIN (for example, 0%). Thus, if the level of the produced sound signal is high, a sound is not transmitted to a different apparatus, so that an echo can be reliably suppressed.

An output signal of the attenuation section 32 is input to the post processor 52 of the echo canceller 15. The post processor 52 subtracts an output signal of the adaptive filter 51 from the output signal of the attenuation section 32. The adaptive filter 51 estimates a transfer function of acoustic space from the loudspeaker 12 to the microphone. The adaptive filter 51 filters a produced sound signal input from the input/output I/F 16 according to the estimated transfer function and generates and outputs a pseudo echo component. A signal in which the pseudo echo component is removed by the post processor 52 is input to the adaptive filter 51 and becomes a reference signal to update the transfer function. The adaptive filter 51 automatically updates the transfer function to make the pseudo echo component similar to the actual echo component based on the reference signal. The update degree of the adaptive filter 51 is determined by various parameters (the number of taps, the step size, etc.,). An update parameter is set by the control section 17. For example, if the number of taps is set large, long reverberation, etc., can be handled and the echo component can be removed appropriately, but the computation amount increases.

The signal in which the echo component is removed by the echo canceller 15 is input to the input/output I/F 16 and is transmitted to a different apparatus. Accordingly, the terminal 1A can transmit and receive a sound to and from the different apparatus.

The terminal 1A of the embodiment switches the operations of the echo suppressor 14 and the echo canceller 15 in response to a volume setting of the user.

In FIG. 2, the user performs volume setting by operating the volume operation section 18. The volume operation section 18 transmits the volume value responsive to the volume set by the user to the control section 17. The volume value is classified into 10 steps, for example. If the volume value exceeds a threshold value (for example, the fifth step, the center of the 10 steps), the control section 17 stops the operation of the echo canceller 15 and operates the echo suppressor 14 only. At this time, the gain of the attenuation section 32 is set to MIN. If the user increases the volume value, it is determined that the user listens to the sound of the associated party and thus the operation is performed so as not to output a collected sound signal, whereby an echo can be reliably suppressed. On the other hand, if the volume value equals to or less than the threshold value, the control section 17 operates the echo canceller 15. At this time, the gain of the attenuation section 32 is set to MAX (namely, the function of the echo suppressor 14 is stopped). At this time, the parameter of the echo canceller 15 may be changed. For example, the number of taps may be set large.

The control section 17 may previously store the volume value at the starting time in internal memory (not shown) as an initial value and if the volume value becomes larger than the initial value, the control section 17 may stop the operation of the echo canceller 15 and may operate the echo suppressor 14 only.

The control section 17 changes settings of the echo suppressor 14 and the echo canceller 15 in response to the volume value. The control section 17 changes the level ratio between the produced sound signal L1 and the collected sound signal L2 for performing gain switch of the echo suppressor 14 in response to the volume value. That is, as shown in FIG. 3(B), if the volume value is large, the level ratio for performing gain switch is set small (in the figure, about 0.7). That is, only when the collected sound signal L2 is considerably larger than the produced sound signal L1, the gain of the attenuation section 32 is set to MAX and the echo canceller 15 is operated. When the volume value is increased, it can be determined that the user listens to the sound of the associated party as described above; when a sound higher than the level of the produced sound signal is collected, it can be determined that the user talks with the volume value intact and thus the echo canceller 15 is operated and double talk is enabled.

On the other hand, as shown in FIG. 3(C), if the volume value is small, the level ratio for performing gain switch is set large (in the figure, about 1.3). That is, only when the produced sound signal L1 is considerably larger than the collected sound signal L2, the gain of the attenuation section 32 is set to MIN and the operation of the echo canceller 15 is stopped. When the volume value is decreased, it can be determined that the user talks, but the user may listen to the sound of the associated party with the volume value intact; only when the level of the collected sound signal is considerably small, setting is made so as not to output the collected sound signal.

Figures 4, 5:
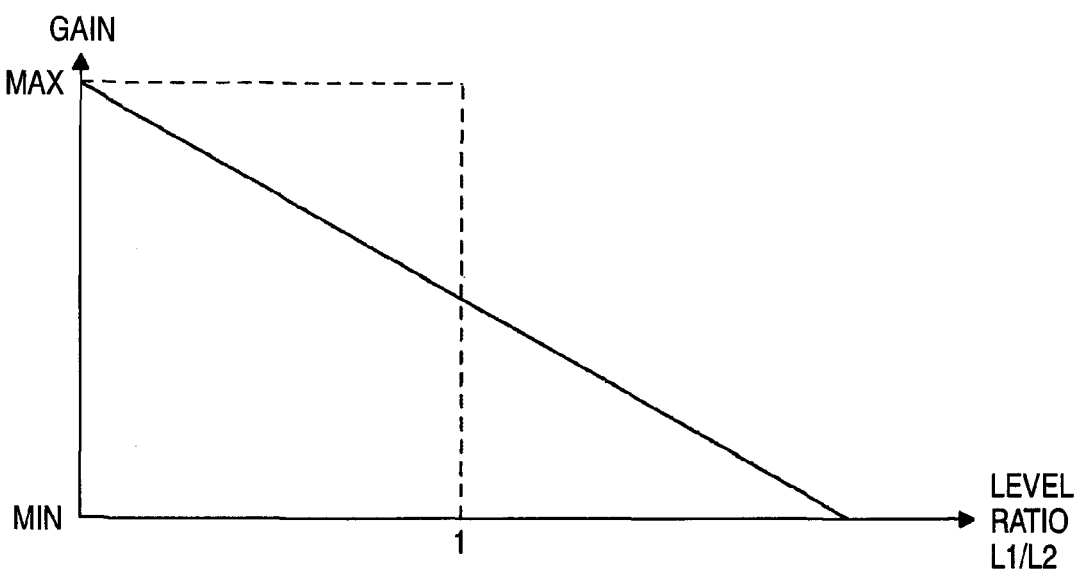
FIG. 4 is a table to show the relationship between the volume values and the setup values of an echo suppressor 14 and an echo canceller 15 according to an application example.
FIG. 5 is a drawing to show gains of the attenuation section 32 relative to the ratio between the produced sound signal L1 and the collected sound signal L2 according to the application example.

Next, FIG. 4 is a table to show the relationship between the volume values and the setup values of the echo suppressor 14 and the echo canceller 15 according to an application example. In the application example, the effectiveness state of the echo suppressor 14 and the echo canceller 15 is switched smoothly. The table shown in the figure is stored in internal memory of the control section 17. If the volume value is changed, the control section 17 references the table and sets the gain of the echo suppressor 14 (attenuation section 32) and the parameter of the echo canceller 15 (adaptive filter 51). For example, if the volume value is the 0th step (minimum) of 10 steps, the possibility that an echo will occur is low and thus the function of the echo suppressor 14 is stopped. This means that the gain of the attenuation section 32 is set to 100%. On the other hand, the effectiveness of the echo canceller 15 is set strong so that if an echo occurs, the echo can be removed. For example, the number of taps of the adaptive filter 51 is set large and a long reverberation time can also be handled.

If the volume value is the first step of the ten steps, the gain of the attenuation section 32 is set to about 90% and the number of taps of the adaptive filter 51 is lessened. If the volume value becomes further large, the gain of the attenuation section 32 is made further small and the number of taps of the adaptive filter 51 is lessened. If the volume value becomes the maximum, the gain of the attenuation section 32 is set to 0% and setting is made so as not to output the collected sound signal. At this time, the operation of the echo canceller 15 is stopped.

Thus, as the volume value becomes larger, the effectiveness of the echo suppressor 14 is made stronger and the effectiveness of the echo canceller 15 is set weak, whereby the operation of the echo suppressor 14 and the echo canceller 15 is switched smoothly.

The table may be able to be changed in response to the actual installation environment. For example, a plurality of tables different in parameters and gain values for volume values may be previously stored in memory and the user may be able to select an appropriate table on the spot.

The control section 17 may smoothly change the gain for the level ratio between the produced sound signal L1 and the collected sound signal L2 in response to the volume value. FIG. 5 is a drawing to show gains of the attenuation section 32 relative to the ratio between the produced sound signal L1 and the collected sound signal L2 according to the application example. In the example shown in FIGS. 3(A), 3(B), and 3(C), if the value of (produced sound signal L1)/(collected sound signal L2) exceeds a predetermined value, the gain is set to 0%; in the example in FIG. 5, the gain of the attenuation section 32 is set in response to the value of (produced sound signal L1)/(collected sound signal L2). That is, setting is made so as not to output the collected sound signal only if the value of (produced sound signal L1)/(collected sound signal L2) is very large, and the gain of the attenuation section 32 is increased gradually as the value of (produced sound signal L1)/(collected sound signal L2) becomes smaller (the level of the produced sound signal becomes smaller) and the echo canceller 15 is operated concurrently. Accordingly, the operation of the echo suppressor and the echo canceller is switched more naturally.

While the invention has been described in detail with reference to the specific embodiments, it will be obvious to those skilled in the art that various changes and modifications can be made without departing from the spirit or the scope of the invention.

The invention is based on Japanese Patent Application (No. 2007-253906) filed on Sep. 28, 2007, the contents of which are incorporated herein by reference.

The invention claimed is:

1. An echo removing apparatus, comprising:
    a sound operation section that accepts a volume operation of a produced sound;
    an echo canceller that generates a pseudo echo signal based on a produced sound signal and removes the pseudo echo signal from a collected sound signal to suppress an echo component;
    an echo suppressor that suppresses a gain of the collected sound signal based on a comparison result between the produced sound signal and the collected sound signal; and
    a control section that performs switching between an operation of the echo canceller and an operation of the echo suppressor based on the volume operation of the sound operation section,
    wherein the switching is performed to stop the operation of the echo canceller when a volume value determined by the volume operation exceeds a first threshold value, and stop the operation of the echo suppressor when the volume value is equal to or less than a second threshold value.

2. The echo removing apparatus according to claim 1, further comprising:

a storage section that stores a parameter of the echo canceller and a gain of the echo suppressor which correspond to a volume setup value of the sound operation section, wherein the control section reads the parameter of the echo canceller and the gain of the echo suppressor from the storage section based on the volume operation of the sound operation section and sets the parameter and the gain in the echo canceller and the echo suppressor.

3. The echo removing apparatus according to claim 1, wherein the echo suppressor suppresses the gain when a level ratio between the produced sound signal and the collected sound signal exceeds a threshold value; and wherein the control section changes the threshold value based on the volume operation of the sound operation section.

4. The echo removing apparatus according to claim 1, wherein the echo suppressor changes the gain based on the volume operation of the sound operation section.

5. The echo removing apparatus according to claim 2, wherein the echo suppressor suppresses the gain when a level ratio between the produced sound signal and the collected sound signal exceeds a threshold value; and wherein the control section changes the threshold value based on the volume operation of the sound operation section.

6. The echo removing apparatus according to claim 2, wherein the echo suppressor changes the gain based on the volume operation of the sound operation section.

* * * * *